United States Patent [19]
Gilleo

[11] Patent Number: 6,096,808
[45] Date of Patent: Aug. 1, 2000

[54] SNAP CURE ADHESIVE BASED ON ANHYDRIDE/EPOXY RESINS

[75] Inventor: Ken Gilleo, Chepachet, R.I.

[73] Assignee: Alpha Metals, Inc.., Jersey City, N.J.

[21] Appl. No.: 09/015,164

[22] Filed: Jan. 29, 1998

[51] Int. Cl.[7] .................................................. C08L 63/02
[52] U.S. Cl. .............................................. 523/466; 528/94
[58] Field of Search ................................ 528/94; 523/466

[56] References Cited

U.S. PATENT DOCUMENTS

| | | |
|---|---|---|
| 2,633,458 | 3/1953 | Shokal et al. . |
| 3,394,105 | 7/1968 | Christie . |
| 5,512,372 | 4/1996 | Blanc et al. . |
| 5,654,081 | 8/1997 | Todd . |

FOREIGN PATENT DOCUMENTS

| | | |
|---|---|---|
| 03913488 | 10/1990 | Germany . |
| 1 050 678 | 12/1996 | United Kingdom . |

OTHER PUBLICATIONS

Derwent Publications Ltd., XP–002102193 & JP 05 311047 (Toshiba Chemical Corp.), Nov. 22, 1993.

*Primary Examiner*—Robert Dawson
*Assistant Examiner*—D. Aylward
*Attorney, Agent, or Firm*—Mintz, Levin, Cohn, Ferris, Glovsky and Popeo, P.C.

[57] ABSTRACT

A two-stage accelerator for use in filled anhydride/epoxy systems is disclosed. In particular, the present invention makes use of a first accelerator to initiate curing of the epoxy while the filler becomes wetted, and a second, faster accelerator to complete the curing process.

14 Claims, No Drawings

SNAP CURE ADHESIVE BASED ON ANHYDRIDE/EPOXY RESINS

FIELD OF THE INVENTION

The present invention relates to underflow materials for use in the fabrication of electronic devices. More particularly, the present invention relates to an underflow material comprising a thermoset which employs a two-stage accelerator system.

BACKGROUND OF THE INVENTION

In the electronics industry, electrical components such as resisters, capacitors, inductors, transistors, integrated circuits, chip carriers and the like, are typically mounted on circuit boards in one of two ways. In the first way, the components are mounted on one side of the board and leads from the components extend through holes in the board and are soldered on the opposite side of the board. In the second way, the components are soldered to the same side of the board upon which they are mounted. These latter devices are said to be "surface-mounted."

Surface mounting of electronic components is a desirable technique in that it may be used to fabricate very small circuit structures and lends itself well to process automation. One family of surface-mounted devices, referred to as "flip chips", comprises integrated circuit devices having numerous connecting leads attached to pads mounted on the underside of the device. In connection with the use of flip chips, either the circuit board or the chip is provided with small balls of solder positioned in locations which correspond to the pads on the underside of each chip and on the surface of the circuit board. The chip is mounted by (a) placing it in contact with the board such that the solder balls become sandwiched between the pads on the board and the corresponding pads on the chip; (b) heating the assembly to a point at which the solder is caused to reflow (i.e., melt); and (c) cooling the assembly. Upon cooling, the solder hardens, thereby mounting the flip chip to the board's surface. Tolerances in devices using flip chip technology are critical, as the spacing between individual devices as well as the spacing between the chip and the board is typically very small. For example, spacing of such chips from the surface of the board is typically in the range of 0.5–3.0 mil and is expected to approach micron spacing in the near future.

One problem associated with flip chip technology is that the chips, the solder and the material forming the circuit board often have significantly different coefficients of thermal expansion. As a result, differing expansions as the assembly heats during use can cause severe stresses, i.e., thermomechanical fatigue, at the chip connections and can lead to failures which degrade device performance or in capacitate the device entirely.

In order to minimize thermomechanical fatigue resulting fro m different thermal expansions, thermoset epoxies have been used. Specifically, these epoxies are used as an underflow material which surrounds the periphery of the flip chip and occupies the e space beneath the chip between the underside of the chip and the board which is not occupied by solder. Such epoxy systems provide a level of protection by forming a physical barrier which resists or reduces different expansions among the components of the device .

Improved underflow materials have been developed in which the epoxy thermoset material is provided with a silica powder filler. By varying the amount of filler material, it is possible to cause the coefficient of thermal expansion of the filled epoxy thermoset to match that of the solder. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

At high levels of filler, (i.e., about 70% filler), it becomes very difficult to fully wet out the silica. As a result, highly filled epoxy systems often include a wetting agent, such as an epoxy silane, to enhance the ability of the resin to wet the filler particles. Unfortunately, such wetting agents can be adversely affected by accelerants which are provided to speed the curing of the epoxy system. As a result, it becomes very difficult to design an epoxy system which adequately wets a filler material, and cures within a commercially acceptable time period. Additionally, to date, fast curing epoxy systems have not been practical because the useful pot life of the material becomes significantly reduced as cure time decreases.

SUMMARY OF THE INVENTION

The present invention relates to a filled epoxy system which employs a two-stage accelerator. More specifically, the present invention relates to a thermosetting adhesive resin system comprising at least one epoxy resin, an anhydride hardener, a first catalyst comprising a substituted imidazole, and a second catalyst comprising an unsubstituted imidazole. In one preferred embodiment, the invention relates to thermosetting adhesive resin system which comprises a first epoxy resin comprising bis-phenol F epoxy resin, a second epoxy resin comprising a cycloaliphatic epoxy resin, a fused silica filler, an epoxy-silane surfactant, a first catalyst comprising a substituted imidazole, a second catalyst comprising an unsubstituted imidazole, and an anhydride hardener.

The present invention also relates to a method for controlling the rate of cure of an anhydride/epoxy resin system which comprises the steps of providing a reaction mixture which comprises a first epoxy resin comprising bis-phenol F epoxy resin, a second epoxy resin comprising a cycloaliphatic epoxy resin, a fused silica filler, an epoxy-silane surfactant, an anhydride hardener, and a first catalyst comprising a substituted imidazole; maintaining the reaction mixture for a time and at a temperature at which the filler becomes substantially completely wetted; adding a second catalyst comprising an unsubstituted imidazole to the reaction mixture; and maintaining the reaction mixture for a time and at a temperature at which the resin system can cure.

DETAILED DESCRIPTION OF THE INVENTION

It is well known to use acid anhydride hardeners with epoxies, since such hardeners provide desirable properties such as low moisture absorption and high strength. Anhydride/epoxy resin systems have long been used in electronics to produce component packages and to protect components on circuit boards. More recently, liquid encapsulates have become popular as underfill assemblies for use in conjunction with flip chips. Anhydrides are particularly useful as hardeners because many are low viscosity liquids that can be highly loaded with fillers to achieve desired properties. Additionally, anhydrides react with all types of epoxies as well as with other types of monomers such as polyols. The ability of the anhydride hardeners to co-react makes them very important in designing adhesives and encapsulates which exhibit desired properties.

Unfortunately, anhydrides suffer from the disadvantage that their reaction with epoxy resins is slow. Although accelerators can be used, anhydrides often take many hours to polymerize or cure. Although accelerators, and especially imidazole accelerators can greatly accelerate the polymerization rate, anhydride/epoxies are still considered slow reacting compared to systems which use nitrogen-based hardeners such as substituted imidazoles and amines.

To date, small amounts of accelerators have been used to accelerate the curing reaction in anhydride/epoxy resin systems. Such accelerators are typically substituted liquid types such as 2,4-ethylmethyl imidazole. The hydrocarbon groups on such accelerators serve the two-fold purpose of solubilizing the material in the epoxy resin and reducing the reaction rate to provide a useful working time or pot life. Of course, this results in a compromize between the cure rate of the adhesive and its shelf life. Thus, it would be particularly desirable to identify an accelerator system that can shorten the cure rate to a few minutes, preserve pot life and avoid interaction with the fillers that are commonly used in anhydride-epoxy resin encapsulates intended for use in electronic applications.

Although unsubstituted imidazoles can be used to greatly accelerate the rate of cure for anhydride/epoxy resin systems, these accelerators are relatively insoluble until the resin system is heated to a higher temperature. The result of the heating to an elevated temperature is that the reaction thus initiates too quickly rather than undergoing a controllable, gradual onset. In addition, the unsubstituted imidazole reacts with the surface of common fillers such as the silica fillers that are used in the encapsulates intended for electronics applications. As a result, the viscosity of the encapsulate increases dramatically and difficulties arise in obtaining proper wetting of the filler by the resin and included wetting agents.

The present invention is based upon the discovery that a two-stage accelerator system can be used in connection with filled anhydride/epoxy resins. In particular, the forced stages of the accelerator can comprise a substituted imidazole with a greater solubility and a lower catalytic activity than the unsubstituted imidazole. By employing a substituted imidazole accelerator, it becomes possible to fully wet the filler with the wetting agent and the resins. Upon achieving full wetting of the filler, the very active unsubstituted imidazole may then be added. This accelerator system thus provides a first accelerator that initiates the curing process while providing proper wetting of the filler, as well as a second accelerator that greatly enhances cure speed without affecting the previously achieved filler wetting. As such, the use of the two-stage accelerator system preserves pot life, prevents reaction with the filler, and generates a well-controlled reaction for optimum properties while greatly reducing the cure rate. As a result, the total cure time for typical anhydride/epoxy resin systems is shortened to a range measured in minutes rather than hours.

In one preferred embodiment, a mixture of epoxy resins including cycloaliphatic epoxy resin and bis-phenol F epoxy resin is mixed with an anhydride hardener. A reactive wetting/coupling agent such as an epoxy-silane is added along with a silica ($SiO_2$) filler. It is noted that without the addition of some type of accelerator, the reaction between the silica filler and the silane wetting agent will not occur at a satisfactory rate, if at all. At this point, the first stage accelerator, a substituted imidazole is added. One preferred first stage accelerator is 2-aminoimidazole. The mixture is allowed to react, preferably at room temperature, for a period of about one-four hours. Alternatively, the mixture can be heated to about 50° C. and allowed to react for about 30 minutes. Subsequently, the viscosity would be found to be significantly lower than the starting value as a result of the filler being sufficiently wetted out. Once the filler is wetted out, the second stage accelerator, an unsubstituted imidazole, can be added since the filler is now fully wetted and protected by the epoxy silane. The addition of the second-stage accelerator causes no change since the silica filler is now protected by the wetting agent and the very low solubility of the unsubstituted imidazole at room temperature precludes its catalytic activity from occuring. In a sense, the highly active unsubstituted imidazole is rendered latent by its low solubility. It is noted that if both the substituted and the unsubstituted imidazoles are added to the system together and initially, the viscosity of the resin will greatly increase, thereby preventing proper wetting of the filler and resulting in an undesirable product.

One preferred formulation is presented in Table 1 below. (In Table 1, all percentages are given as a percent by weight.)

TABLE 1

| Component | Percent |
| --- | --- |
| Epoxy-silane (wetting agent) | 0.2–1.0 |
| Epoxy resin (bis-phenyl F) | 5.0–7.5 |
| Epoxy resin cycloaliphatic | 5.0–7.5 |
| Anhydride hardener | 5.0–20.0 |
| Fused Silica Filler | 60.0–75.0 |
| Pigment or Dye (optional) | 0.01–0.1 |
| Substituted Imidazole (First Stage Accelerator) | 0.05–0.1 |
| Unsubstituted Imidazole (Second Stage Accelerator) | 0.05–0.1 |

Note that in Table 1, the ratio of the imidazoles is approximately 1:1. It is noted that this ratio can be varied to achieve different cure rates. Additionally, other reactive resins, such as polyols, can be added to provide more flexible polymers. However, the addition of materials like polyols can reduce the pot life of the resin by solubilizing the imdazole which is relatively insolubile in epoxy resins. In this case, the amount of imidazole can be lowered with only a small effect of the cure rate.

The unsubstituted imidazole material is preferably used in a powder form. In use, the powder is mixed into the resin system and does not substantially begin to react until the resin system is heated to a point at which the unsubstituted imidazole melts. As a result of such a system, in which the imidazole is substantially unreacted prior to hitting the reactants to the melting point of the imidazole, improved shelf life and pot life can be achieved.

It should be noted that the first stage accelerator, i.e., the substituted imidazole, can be essentially any substituted imidazole that is effective in increasing the reaction rate of epoxy resins and anhydrides. The second stage accelerator in unsubstituted imidazole (Chemical Abstracts 288-32-4) having a melting point of about 89–91° C.

The features of the inventive adhesive resin system, while particularly valuable for underfill applications in electronic device manufacture, also offer value generally in the area of electronic encapsulants. The majority of encapsulants and other electronic packaging materials are based on epoxy resins and anhydrides. Nearly all use silica fillers to provide tailored, desired properties. As such, the two-stage accelerator system described above is intended for use in encapsulant applications as well.

EQUIVALENTS

From the foregoing detailed description of the specific embodiments of the invention, it should be apparent that a unique two-stage accelerator system for anhydride/epoxy resin systems has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims. For instance, the choice of the particular reaction temperatures is believed to be a matter of routine for a person of ordinary skill in the art with knowledge of the embodiments described herein.

What is claimed is:

1. A thermosetting adhesive resin system which comprises:
   a) at least one epoxy resin;
   b) an anhydride hardener;
   c) a first catalyst comprising a substituted imidazole; and
   d) a second catalyst comprising an unsubstituted imidazole.

2. A thermosetting adhesive resin system as in claim 1 which further comprises a filler.

3. A thermosetting adhesive resin system as in claim 2 which further comprises a wetting agent for the filler.

4. A thermosetting adhesive resin system as in claim 2 wherein the filler comprises particles of a fused silica.

5. A thermosetting adhesive resin system as in claim 4 which further comprises a wetting agent, the wetting agent including an epoxy-silane surfactant.

6. A thermosetting adhesive resin system as in claim 1 wherein the epoxy resin comprises a mixture of a bis-phennol F epoxy resin and a cycloaliphatic epoxy resin.

7. A thermosetting adhesive resin system which comprises:
   a) a first epoxy resin comprising bis-phennol F epoxy resin;
   b) a second epoxy resin comprising a cycloaliphatic epoxy resin;
   c) a fused silica filler;
   d) an epoxy-silane surfactant;
   e) a first catalyst comprising a substituted imidazole;
   f) a second catalyst comprising an unsubstituted imidazole; and
   g) an anhydride hardener.

8. A thermosetting adhesive resin system as in claim 7 wherein the BisF epoxy resin comprises between about 5.0% and 7.5% of the adhesive by weight.

9. A thermosetting adhesive resin system as in claim 7 wherein the cycloaliphatic epoxy resin comprises between about 5.0% and 7.5% of the adhesive by weight.

10. A thermosetting adhesive resin system as in claim 7 wherein the anhydride comprises between about 5.0% and 20.0% of the adhesive by weight.

11. A thermosetting adhesive resin system as in claim 7 wherein the filler comprises between about 65.0% and 75.0% of the adhesive by weight.

12. A thermosetting adhesive resin system as in claim 7 wherein the surfactant comprises between about 0.2% and 1.0% of the adhesive by weight.

13. A thermosetting adhesive resin system as in claim 7 wherein the first catalyst comprises between about 0.05% and 0.1% of the adhesive by weight.

14. A thermosetting adhesive as in claim 7 wherein the second catalyst comprises between about 0.05% and 0.1% of the adhesive by weight.

* * * * *